US009972898B2

United States Patent
Wu et al.

(10) Patent No.: US 9,972,898 B2
(45) Date of Patent: May 15, 2018

(54) ANTENNA STRUCTURE AND METHOD FOR MANUFACTURING ANTENNA

(71) Applicant: Wistron NeWeb Corp., Hsinchu (TW)

(72) Inventors: Tzu-Min Wu, Hsinchu (TW); Yuan-Chin Hsu, Hsinchu (TW)

(73) Assignee: WISTRON NEWEB CORP., Hsinchu (TW)

( * ) Notice: Subject to any disclaimer, the term of this patent is extended or adjusted under 35 U.S.C. 154(b) by 659 days.

(21) Appl. No.: 14/476,434

(22) Filed: Sep. 3, 2014

(65) Prior Publication Data

US 2015/0070232 A1 Mar. 12, 2015

(30) Foreign Application Priority Data

Sep. 12, 2013 (TW) .............................. 102132929 A

(51) Int. Cl.
| | |
|---|---|
| *H01Q 1/38* | (2006.01) |
| *H01Q 7/06* | (2006.01) |
| *H05K 3/18* | (2006.01) |
| *H05K 3/42* | (2006.01) |

(52) U.S. Cl.
CPC ............... *H01Q 1/38* (2013.01); *H01Q 7/06* (2013.01); *H05K 3/182* (2013.01); *H05K 3/422* (2013.01); *H05K 2201/0195* (2013.01); *H05K 2201/086* (2013.01); *H05K 2201/10098* (2013.01); *H05K 2203/073* (2013.01); *H05K 2203/0709* (2013.01); *Y10T 29/49016* (2015.01)

(58) Field of Classification Search
CPC .................................. H01Q 1/38; H01Q 7/06

USPC .......................................................... 343/787
See application file for complete search history.

(56) References Cited

U.S. PATENT DOCUMENTS

| | | | |
|---|---|---|---|
| 2012/0061851 A1* | 3/2012 | Rathburn ............. | B23K 1/0016 257/774 |
| 2013/0234899 A1* | 9/2013 | Pope ..................... | H01Q 1/243 343/702 |

FOREIGN PATENT DOCUMENTS

| | | | | |
|---|---|---|---|---|
| CN | 1988251 | A | | 6/2007 |
| CN | 2063489 | A1 | | 5/2009 |
| CN | 101501930 | A | | 8/2009 |
| CN | 101719587 | A | | 6/2010 |
| CN | 202496171 | U | | 10/2012 |
| CN | 202976161 | U | | 6/2013 |
| EP | 2063489 | | * 5/2009 | .............. H01Q 7/08 |
| TW | 200709066 | A | | 3/2007 |
| TW | 200828679 | A | | 7/2008 |

* cited by examiner

*Primary Examiner* — Andrea Lindgren Baltzell
(74) *Attorney, Agent, or Firm* — Muncy, Geissler, Olds & Lowe, P.C.

(57) ABSTRACT

A method for manufacturing an antenna includes the steps of: providing a ferrite sheet; forming a via hole through the ferrite sheet, wherein the via hole is connected between a first surface and a second surface of the ferrite sheet; forming a nonconductive ink layer on the first surface and the second surface and in the via hole of the ferrite sheet; applying a displacement process to the nonconductive ink layer so as to form a first metal layer on the nonconductive ink layer; and applying a thickening process to the first metal layer so as to form a second metal layer on the first metal layer, wherein the first metal layer and the second metal layer both extend from the first surface through the via hole to the second surface of the ferrite sheet.

18 Claims, 7 Drawing Sheets

ANTENNA STRUCTURE AND METHOD FOR MANUFACTURING ANTENNA

CROSS REFERENCE TO RELATED APPLICATIONS

This Application claims priority of Taiwan Patent Application No. 102132929 filed on Sep. 12, 2013, the entirety of which is incorporated by reference herein.

BACKGROUND OF THE INVENTION

Field of the Invention

The disclosure generally relates to a method for manufacturing an antenna, and more particularly, to a method for manufacturing a thin and low-cost antenna.

Description of the Related Art

With the progress of mobile communication technology, mobile devices, such as portable computers, mobile phones, multimedia players, and other hybrid functional portable electronic devices, have become more common To satisfy user demand, portable electronic devices can usually perform wireless communication functions. Some functions cover a large wireless communication area; for example, mobile phones using 2G, 3G, and LTE (Long Term Evolution) systems and using frequency bands of 700 MHz, 850 MHz, 900 MHz, 1800 MHz, 1900 MHz, 2100 MHz, 2300 MHz, and 2500 MHz. Some functions cover a small wireless communication area; for example, mobile phones using Wi-Fi, Bluetooth, and WiMAX (Worldwide Interoperability for Microwave Access) systems and using frequency bands of 2.4 GHz, 3.5 GHz, 5.2 GHz, and 5.8 GHz.

In a mobile device, an antenna structure for wireless communication is an indispensable component. Furthermore, an absorber which provides effective energy absorption properties is generally attached to the antenna structure so as to prevent the antenna structure from being interfering with other electronic or metal components in the mobile device. However, the absorber may increase the total thickness of the antenna structure and increase the complexity of the process for assembling the whole antenna system.

BRIEF SUMMARY OF THE INVENTION

To solve the problem of the prior art, in one exemplary embodiment, the disclosure is directed to a method for manufacturing an antenna includes the steps of: providing a ferrite sheet; forming a via hole through the ferrite sheet, wherein the via hole is connected between a first surface and a second surface of the ferrite sheet; forming a nonconductive ink layer on the first surface and the second surface and in the via hole of the ferrite sheet; applying a displacement process to the nonconductive ink layer so as to form a first metal layer on the nonconductive ink layer; and applying a thickening process to the first metal layer so as to form a second metal layer on the first metal layer, wherein the first metal layer and the second metal layer both extend from the first surface through the via hole to the second surface of the ferrite sheet.

In another exemplary embodiment, the disclosure is directed to an antenna structure for use in an electronic device, including a ferrite sheet, a nonconductive ink layer, a first metal layer, and a second metal layer. At least one via hole is formed through the ferrite sheet. The via hole is connected between a first surface and a second surface of the ferrite sheet. The nonconductive ink layer is formed on the first surface and the second surface and in the via hole of the ferrite sheet. The first metal layer is formed on the nonconductive ink layer by applying a displacement process to the nonconductive ink layer. The second metal layer is formed on the first metal layer by applying a thickening process to the first metal layer. The first metal layer and the second metal layer extend from the first surface through the via hole to the second surface of the ferrite sheet.

In alternative exemplary embodiments, the disclosure is directed to a method for manufacturing an antenna, including the steps of: providing a ferrite sheet; forming at least one via hole through the ferrite sheet, wherein the via hole is connected between a first surface and a second surface of the ferrite sheet; forming a nonconductive ink layer on the first surface and the second surface and in the via hole of the ferrite sheet; applying a reduction-oxidation process to the nonconductive ink layer so as to form a metal atomic layer on the nonconductive ink layer; and applying a chemical-plating process to the metal atomic layer so as to form a metal layer on the metal atomic layer, wherein the metal atomic layer and the metal layer extend from the first surface through the via hole to the second surface of the ferrite sheet.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

In order to illustrate the purposes, features and advantages of the invention, the embodiments and figures of the invention are shown in detail as follows.

The invention provides a method for manufacturing an antenna, and the method includes multiple steps. The following drawings represent intermediate or finished antenna structure products corresponding to the respective steps of the method, for the reader to easily comprehend. It should be understood that these steps of the method for manufacturing an antenna are not required to be performed in order of the drawings. In response to different user requirements, any one or more steps of the method may be incorporated or omitted.

Figure 1:
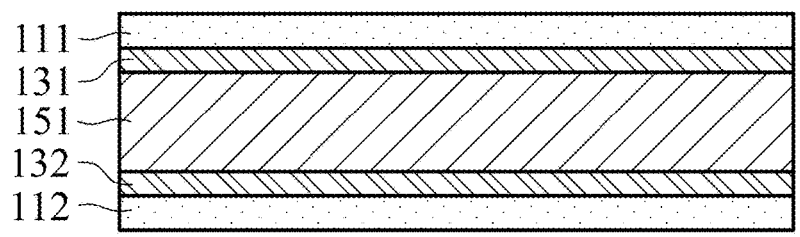
FIG. 1 is a cross-sectional view of an antenna structure in one step of a manufacturing method according to an embodiment of the invention.

FIG. 1 is a cross-sectional view of an antenna structure in one step of the manufacturing method according to an embodiment of the invention. In the step of FIG. 1, a ferrite sheet 100 is provided. The ferrite sheet 100 can reject electromagnetic waves and improve radiation performance of an antenna structure. As shown in FIG. 1, the ferrite sheet 100 includes a first PET (Polyethylene Terephthalate ' PET) layer 111, a second PET layer 112, a first gel layer 131, a second gel layer 132, and a ferrite layer 151. The first gel layer 131 is configured to adhere the first PET layer 111 to the ferrite sheet 151. The second gel layer 132 is configured to adhere the second PET layer 112 to the ferrite sheet 151. The ferrite layer 151 is disposed between the first PET layer 131 and the second PET layer 132.

Figure 2:
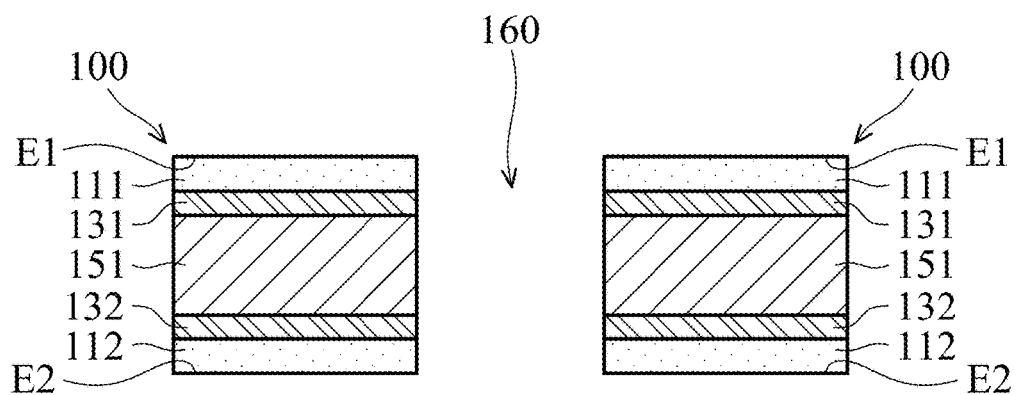
FIG. 2 is a cross-sectional view of an antenna structure in one step of a manufacturing method according to an embodiment of the invention.

FIG. 2 is a cross-sectional view of the antenna structure in one step of the manufacturing method according to an embodiment of the invention. In the step of FIG. 2, at least one via hole 160 is formed through the ferrite sheet 100, and the via hole 160 is connected between a first surface E1 and a second surface E2 of the ferrite sheet 100. The first surface E1 is opposite to the second surface E2. It should be understood that in fact, the via hole 160 does not divide the ferrite sheet 100 into two separate pieces. The display of FIG. 2 is used for the reader to easily comprehend; however, in fact, the two pieces of the ferrite sheet 100 are partially connected to each other (please refer to FIG. 6A and FIG. 6B), and the size of the via hole 160 is much smaller than that of the ferrite sheet 100. The via hole 160 has a small diameter, such as 0.5 mm. In other embodiments, the method for manufacturing an antenna includes the steps of forming multiple via holes 160 through the ferrite sheet 100, such as two, three, or four via holes 160.

Figure 3:
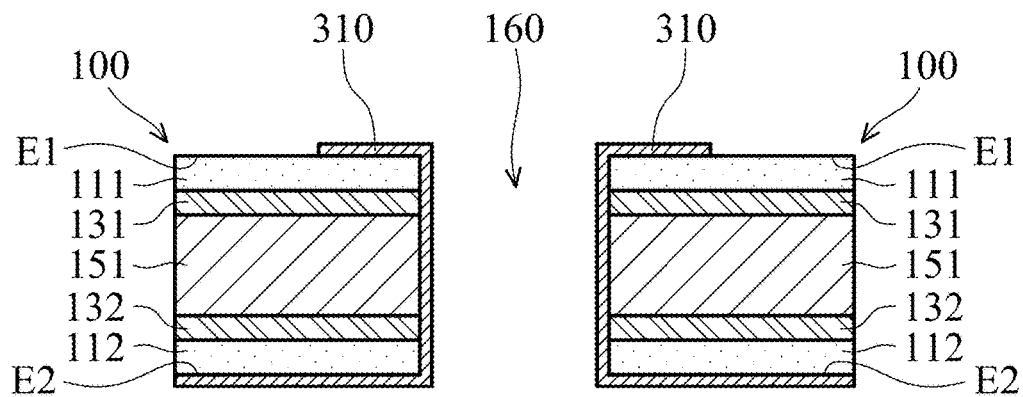
FIG. 3 is a cross-sectional view of an antenna structure in one step of a manufacturing method according to an embodiment of the invention.

FIG. 3 is a cross-sectional view of the antenna structure in one step of the manufacturing method according to an embodiment of the invention. In the step of FIG. 3, a nonconductive ink layer 310 is formed on the first surface E1 and the second surface E2 and in the via hole 160 of the ferrite sheet 100. That is, the nonconductive ink layer 310 extends from the first surface E1 through the via hole 160 to the second surface E2 of the ferrite sheet 100. Similarly, the display of FIG. 3 is used for the reader to easily comprehend, and in fact, two portions of the nonconductive ink layer 310 on the two pieces of the ferrite sheet 100 are partially connected to each other. The nonconductive ink layer 310 includes base metal powder and epoxy. For example, the nonconductive ink layer 310 may be formed through a screen printing process, a pad printing process, or a spraying process. For example, the epoxy may be a synthesis of ECH (Epichlorohydrin) and BPA (Bisphenol A). For example, the base metal powder may include iron, nickel, zinc, or aluminum. The base metal powder may account for about 40% to 70% of the nonconductive ink layer 310.

Figure 4:
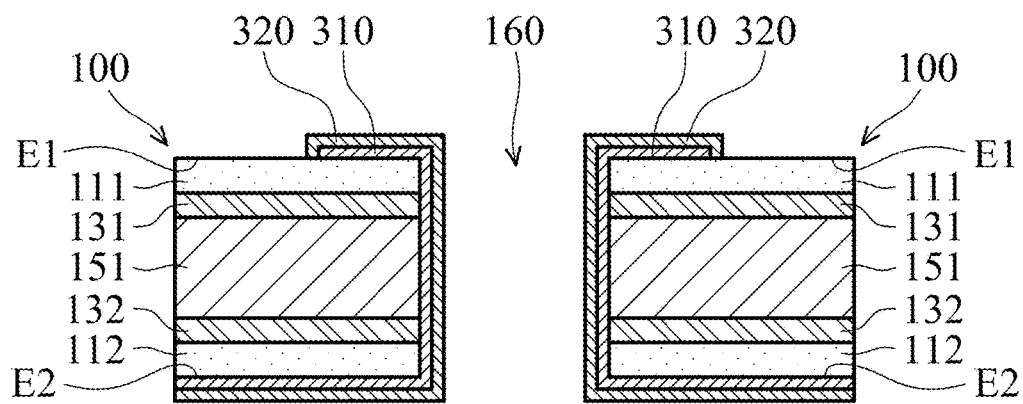
FIG. 4 is a cross-sectional view of an antenna structure in one step of a manufacturing method according to an embodiment of the invention.

FIG. 4 is a cross-sectional view of the antenna structure in one step of the manufacturing method according to an embodiment of the invention. In the step of FIG. 4, a displacement process is applied to the nonconductive ink layer 310 so as to form a first metal layer 320 on the nonconductive ink layer 310. The displacement process may include the operation of placing the ferrite sheet 100 and the nonconductive ink layer 310 into aqueous solution which includes precious metal ions. The base metal powder of the nonconductive ink layer 310 may react with the precious metal ions in the aqueous solution. As a result, the base metal powder may be oxidized and dissolved in the aqueous solution, and the precious metal ions may be deoxidized so as to form the first metal layer 320. For example, the first metal layer 320 may include copper, nickel, silver, palladium, platinum, and/or gold, and the thickness of the first metal layer 320 is smaller than or equal to 5 µm. In addition, the first metal layer 320 may be further configured to form a pad on the first surface E1 of the ferrite sheet 100 (please refer to FIG. 6A), and/or to form an antenna branch on the second surface E2 of the ferrite sheet 100 (please refer to FIG. 6B).

Figure 5:
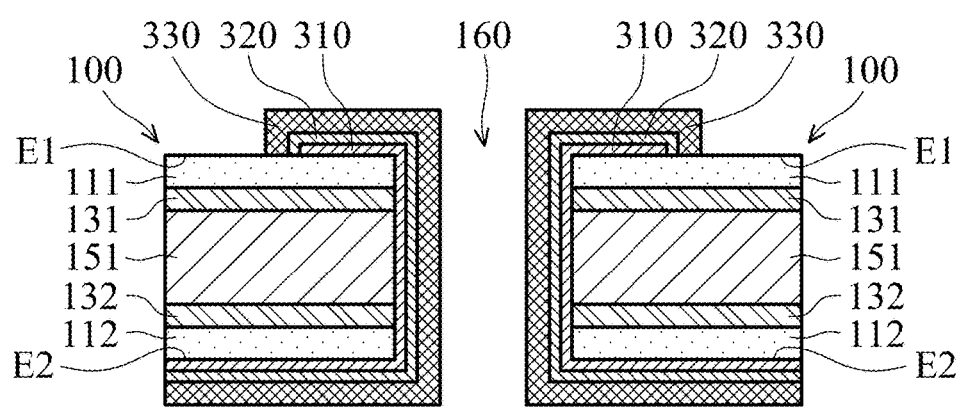
FIG. 5 is a cross-sectional view of an antenna structure in one step of a manufacturing method according to an embodiment of the invention.

FIG. 5 is a cross-sectional view of the antenna structure in one step of the manufacturing method according to an embodiment of the invention. In the step of FIG. 5, a thickening process is applied to the first metal layer 320 so as to form a second metal layer 330 on the first metal layer 320. For example, the thickening process may be a chemical-plating process or an electroplating process. The thickening process is performed so as to increase the stability of the antenna structure. The material of the second metal layer 330 may be the same as that of the first metal layer 320. For example, the second metal layer 330 may include copper, nickel, silver, palladium, platinum, and/or gold, and the thickness of the second metal layer 330 is from 2 µm to 40 µm. The first metal layer 320 and the second metal layer 330 both extend from the first surface E1 through the via hole 160 to the second surface E2 of the ferrite sheet 100. Adjustments may be made such that the second metal layer 330 completely fills the via hole 160 of the ferrite sheet 100 when the thickening process has been performed (not shown).

Figure 6A:
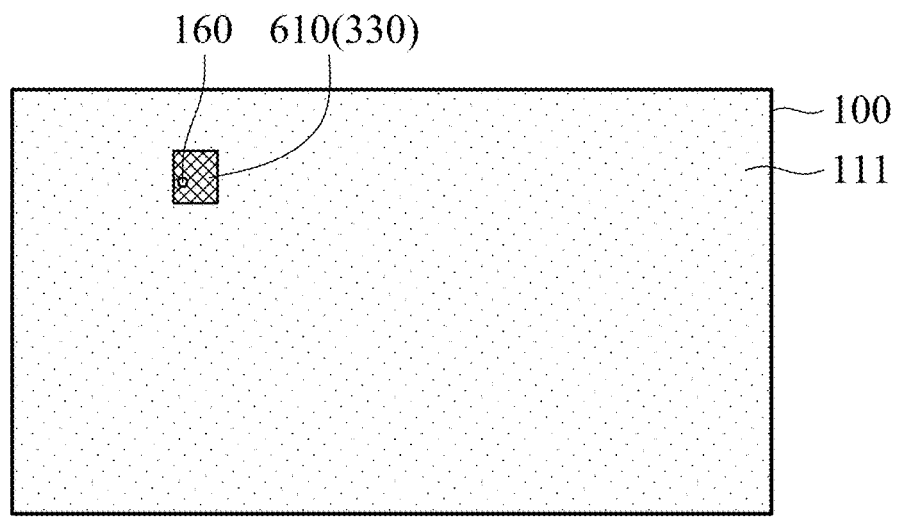
FIG. 6A is a top view of an antenna structure related to the manufacturing method according to an embodiment of the invention.

FIG. 6A is a top view of the antenna structure related to the manufacturing method according to an embodiment of the invention. With respect to the antenna structure of FIG. 6A, a pad 610 is formed on the first surface E1 of the ferrite sheet 100 by using the first metal layer 320 and the second metal layer 330. The pad 610 may be further coupled through a connection element (e.g., a pogo pin or a spring) to a signal source (not shown), and the antenna structure may be excited accordingly.

Figure 6B:
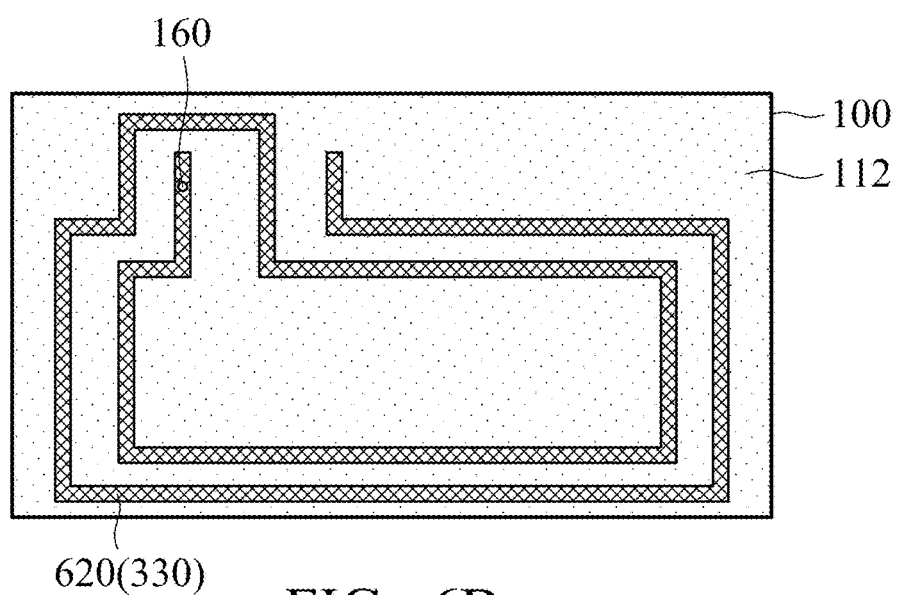
FIG. 6B is a bottom view of an antenna structure related to the manufacturing method according to an embodiment of the invention.

FIG. 6B is a bottom view of the antenna structure related to the manufacturing method according to an embodiment of the invention. With respect to the antenna structure of FIG. 6B, an antenna branch 620 is formed on the second surface E2 of the ferrite sheet 100 by using the first metal layer 320 and the second metal layer 330. In other words, the pad 610 may be a portion of the first metal layer 320 and the second metal layer 330, and the antenna branch 620 may be may be another portion of the first metal layer 320 and the second metal layer 330. The antenna branch 620 may be configured as a main radiator of the antenna structure, and the total length of the antenna branch 620 may be equal to 0.5 or 0.25 wavelength of the corresponding frequency. The shape of the antenna branch 620 is not limited in the invention. For example, the antenna branch 620 may have a meandering shape, such as a loop shape, a U-shape, or an S-shape. It should be noted that although FIG. 6A and FIG. 6B merely display a single pad 610 and a single antenna branch 620, in other embodiments, the antenna structure may include multiple pads 610 and multiple antenna branches 620 for operation in multiple frequency bands.

The finished product of the antenna structure may be further assembled and used in at least two different ways. The following embodiments of FIGS. 7A, 7B, and 7C describe the first assemble way.

Figure 7A:
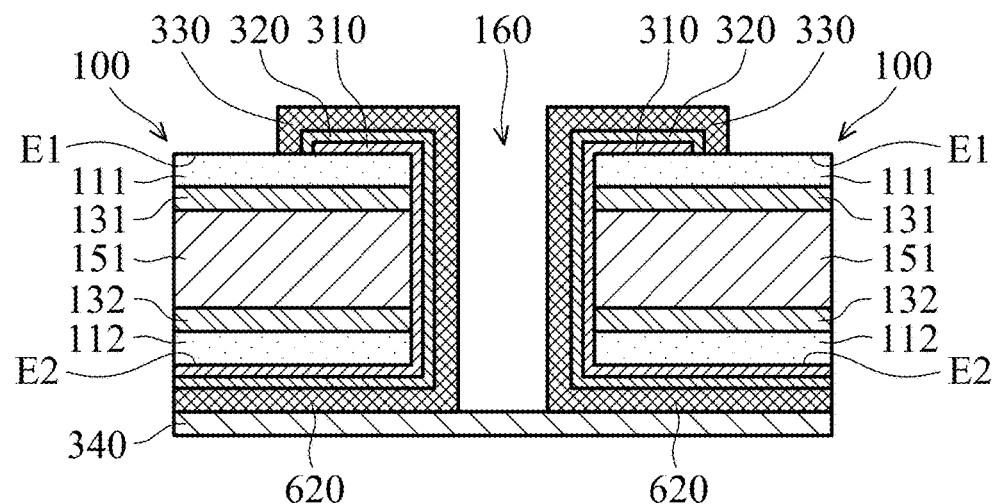
FIG. 7A is a cross-sectional view of an antenna structure in one step of a manufacturing method according to an embodiment of the invention.

FIG. 7A is a cross-sectional view of the antenna structure in one step of the manufacturing method according to an embodiment of the invention. In the step of FIG. 7A, a fitting process is applied so as to form a first protection layer 340 on the antenna branch 620 (i.e., a portion of the second metal layer 330). For example, the first protection layer 340 may be made of a nonconductive material.

Figure 7B:
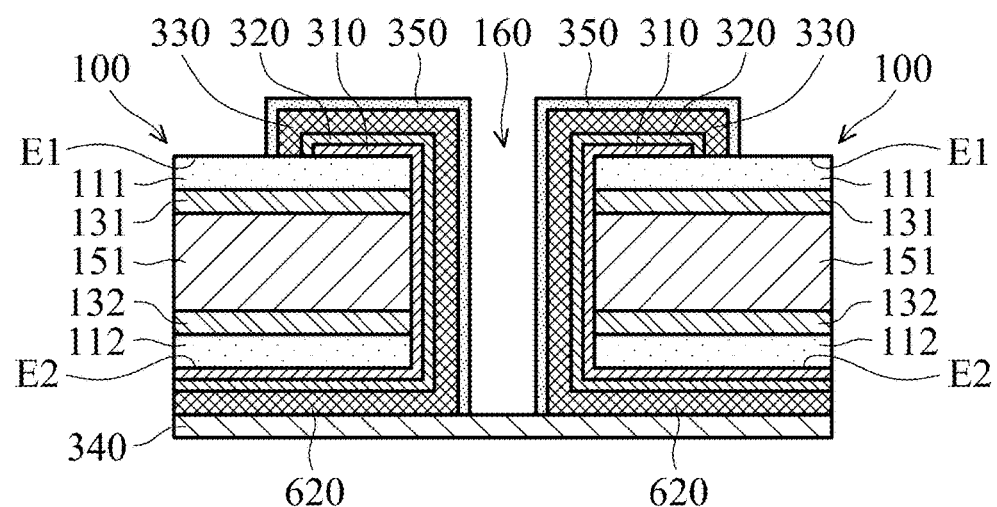
FIG. 7B is a cross-sectional view of an antenna structure in one step of a manufacturing method according to an embodiment of the invention.

FIG. 7B is a cross-sectional view of the antenna structure in one step of the manufacturing method according to an embodiment of the invention. In the step of FIG. 7B, a surface treatment process is applied so as to form a second protection layer 350 on the second metal layer 330. For example, the second protection layer 350 may be a nickel/gold-plated board or an OSP (Organic Solderability Preservative) film. The first protection layer 340 and the second protection layer 350 are configured to cover the first metal layer 320 and the second metal layer 330 completely, such that the first metal layer 320, the second metal layer 330, and the pad 610 and antenna branch 620 thereof are prevented from being worn out or oxidized. In some embodiments, the second protection layer 350 has an opening, and the pad 610 is coupled through the opening to a signal source (not shown).

Figure 7C:
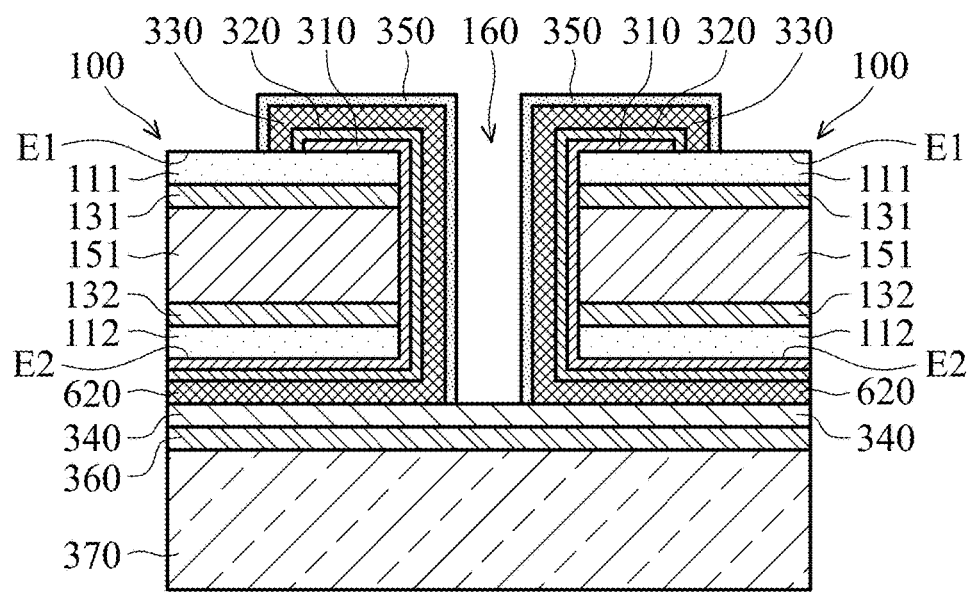
FIG. 7C is a cross-sectional view of an antenna structure in one step of a manufacturing method according to an embodiment of the invention.

FIG. 7C is a cross-sectional view of the antenna structure in one step of the manufacturing method according to an embodiment of the invention. In the step of FIG. 7C, the first protection layer 340 of the antenna structure is adhered to a case 370 by using an adhesion layer 360. For example, the case 370 may be a portion of an electronic device, and the electronic device may be a smartphone, a tablet computer, or a notebook computer.

Figure 8A:
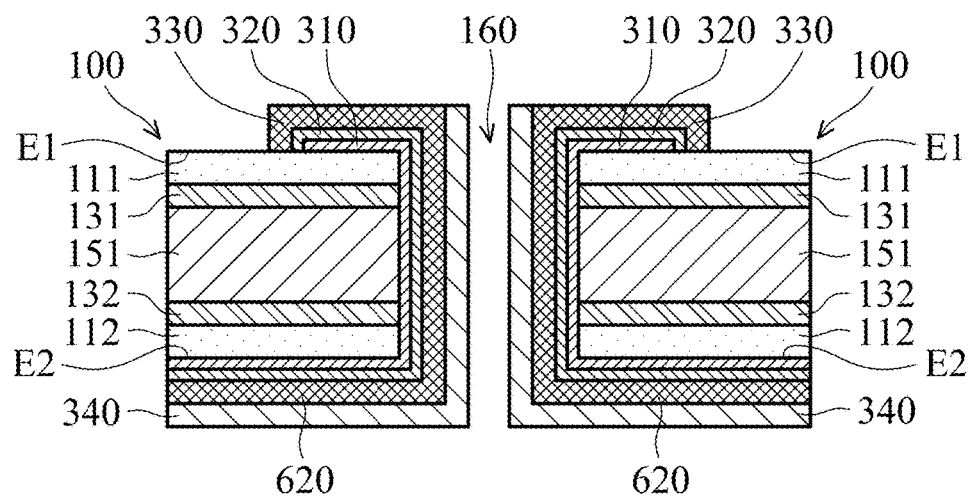
FIG. 8A is a cross-sectional view of an antenna structure in one step of a manufacturing method according to an embodiment of the invention.
Figure 8B:
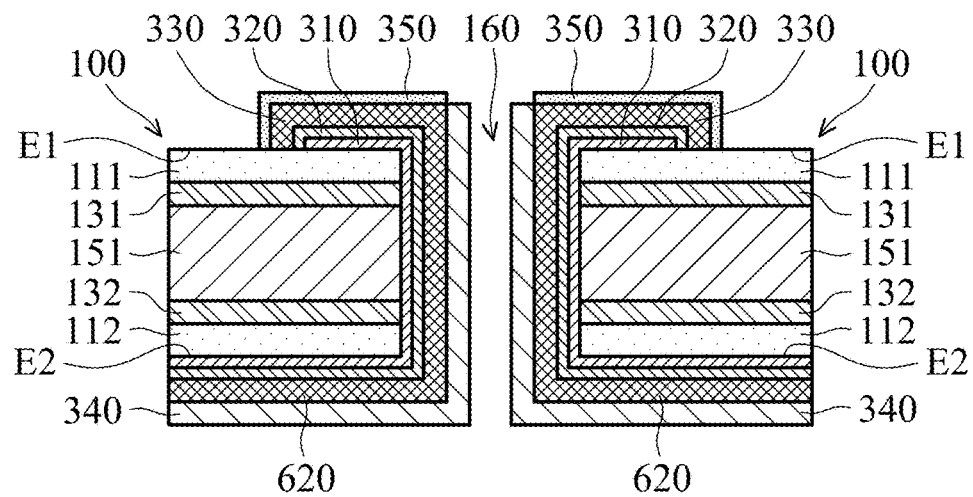
FIG. 8B is a cross-sectional view of an antenna structure in one step of a manufacturing method according to an embodiment of the invention.
Figure 8C:
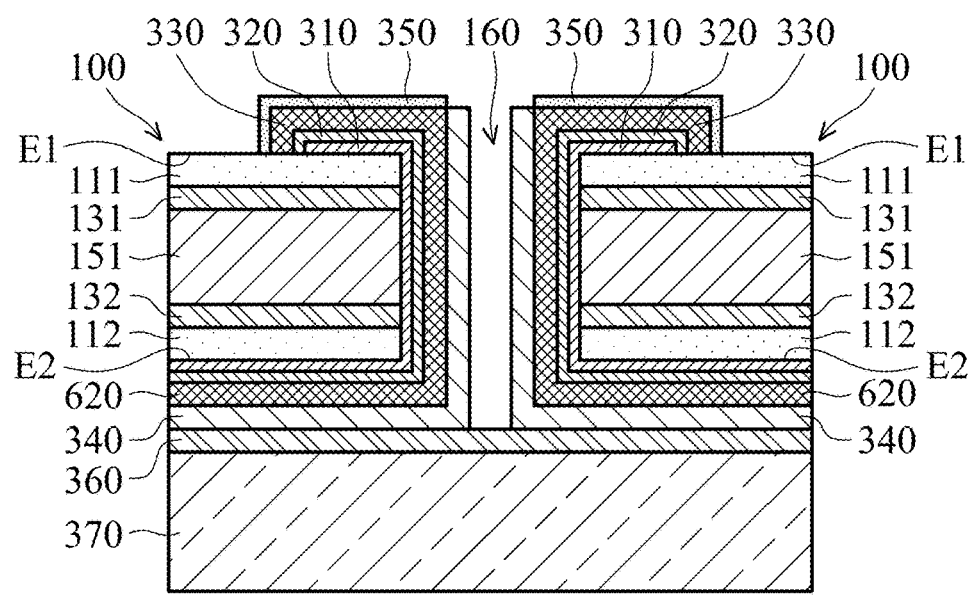
FIG. 8C is a cross-sectional view of an antenna structure in one step of a manufacturing method according to an embodiment of the invention.

On the other hand, the following embodiments of FIGS. 8A, 8B, and 8C describe the second assemble way.

FIG. 8A is a cross-sectional view of the antenna structure in one step of the manufacturing method according to an embodiment of the invention. In the step of FIG. 8A, a printing process is applied so as to form a first protection layer 340 on the second metal layer 330. For example, the first protection layer 340 may be made of a nonconductive material. The difference from the embodiment of FIG. 7A is that the first protection layer 340 formed through the printing process is further configured to cover the metal portions disposed in the via hole 160 of the ferrite sheet 100.

FIG. 8B is a cross-sectional view of the antenna structure in one step of the manufacturing method according to an embodiment of the invention. In the step of FIG. 8B, a surface treatment process is applied so as to form a second protection layer 350 on the second metal layer 330. For example, the second protection layer 350 may be a nickel/gold-plated board or an OSP (Organic Solderability Preservative) film. The first protection layer 340 and the second protection layer 350 are configured to cover the first metal layer 320 and the second metal layer 330 completely, such that the first metal layer 320, the second metal layer 330, and the pad 610 and antenna branch 620 thereof are prevented from being worn out or oxidized. In some embodiments, the second protection layer 350 has an opening, and the pad 610 is coupled through the opening to a signal source (not shown).

FIG. 8C is a cross-sectional view of the antenna structure in one step of the manufacturing method according to an embodiment of the invention. In the step of FIG. 8C, the first protection layer 340 of the antenna structure is adhered to a case 370 by using an adhesion layer 360. For example, the case 370 may be a portion of an electronic device, and the electronic device may be a smartphone, a tablet computer, or a notebook computer.

In alternative embodiments, the manufacturing method includes the steps of applying a reduction-oxidation process to the nonconductive ink layer so as to form a metal atomic layer on the nonconductive ink layer, and applying a chemical-plating process to the metal atomic layer so as to form a metal layer on the metal atomic layer. The metal atomic layer and the metal layer further extend from the first surface through the via hole to the second surface of the ferrite sheet. The displacement process and the thickening process of FIG. 4 and FIG. 5 may be replaced with the above reduction-oxidation process and chemical-plating process. The nonconductive ink layer includes catalytic metal ions and epoxy. For example, the catalytic metal ions may include copper ions, silver ions, or palladium ions. The reduction-oxidation process includes soaking the nonconductive ink layer in a reducing agent. For example, the reducing agent may include at least one of sodium borohydride, hypophosphite, and amine compounds. For example, the nonconductive ink layer may include palladium chloride on its surface, and the palladium chloride may be reduced by the reducing agent so as to form palladium atoms. The metal atomic layer may include palladium. The chemical-plating process includes using at least one of copper sulfate, formaldehyde, sodium hydroxide, and ethylenediamine tetraacetic acid as a chemical-plating agent. For example, the chemical-plating process has a chemical reaction equation (1) as follows:

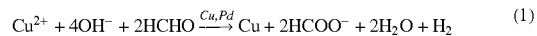

$$Cu^{2+} + 4OH^- + 2HCHO \xrightarrow{Cu,Pd} Cu + 2HCOO^- + 2H_2O + H_2 \quad (1)$$

The palladium may be used as a catalyst and the copper may be deposited on the palladium. The metal layer may include copper. After the chemical-plating process is performed, the metal layer may be thickened further by performing an electroplating process.

In comparison to the prior art, the invention has at least the following advantages of: (1) reducing the total thickness by integrating the antenna structure with the ferrite sheet, (2) simplifying the process for assembling and manufacturing the antenna structure, and (3) decreasing the total cost for manufacturing the antenna structure.

Furthermore, the invention provides an antenna structure, which is made by the above manufacturing method, and its intermediate or finished products have been described in the embodiments of FIGS. 1 to 8C and will not be described again here.

Note that the above element sizes, element parameters, and element shapes are not limitations of the invention. An antenna engineer can adjust these settings or values according to different requirements. It is understood that the antenna structure and manufacturing method of the invention are not limited to the configurations of FIGS. 1 to 8C. The invention may merely include any one or more features of any one or more embodiments of FIGS. 1 to 8C. In other words, not all of the features shown in the figures should be implemented in the antenna structure and manufacturing method of the invention.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for manufacturing an antenna, comprising the steps of:
   providing a ferrite sheet;
   forming at least one via hole through the ferrite sheet, wherein the via hole is connected between a first surface and a second surface of the ferrite sheet;
   forming a nonconductive ink layer on the first surface and the second surface and in the via hole of the ferrite sheet;
   applying a displacement process to the nonconductive ink layer so as to form a first metal layer on the nonconductive ink layer; and
   applying a thickening process to the first metal layer so as to form a second metal layer on the first metal layer, wherein the first metal layer and the second metal layer extend from the first surface through the via hole to the second surface of the ferrite sheet,
   wherein the nonconductive ink layer comprises base metal powder, and
   wherein the displacement process includes placing the ferrite sheet and the nonconductive ink layer into aqueous solution which includes precious metal ions.

2. The method as claimed in claim 1, wherein the ferrite sheet comprises a first PET (Polyethylene Terephthalate, PET) layer, a second PET layer, a first gel layer, a second gel layer, and a ferrite layer, the first gel layer is configured to adhere the first PET layer to the ferrite sheet, the second gel layer is configured to adhere the second PET layer to the ferrite sheet, and the ferrite layer is disposed between the first PET layer and the second PET layer.

3. The method as claimed in claim 1, wherein the nonconductive ink layer further comprises epoxy.

4. The method as claimed in claim 1, wherein the first metal layer and the second metal layer each comprise copper, nickel, silver, palladium, platinum, and/or gold.

5. The method as claimed in claim 1, wherein the thickening process is a chemical-plating process or an electroplating process.

6. The method as claimed in claim 1, further comprising:
   forming a pad on the first surface of the ferrite sheet by using the first metal layer and the second metal layer.

7. The method as claimed in claim 1, further comprising:
   forming an antenna branch on the second surface of the ferrite sheet by using the first metal layer and the second metal layer.

8. The method as claimed in claim 7, further comprising:
   applying a fitting process or a printing process so as to form a first protection layer on the antenna branch.

9. The method as claimed in claim 8, further comprising:
   applying a surface treatment process so as to form a second protection layer on the second metal layer, wherein the first protection layer and the second protection layer are configured to cover the first metal layer and the second metal layer completely.

10. The method as claimed in claim 9, wherein the second protection layer is a nickel/gold-plated board or an OSP (Organic Solderability Preservative) film.

11. The method as claimed in claim 9, further comprising:
    adhering the first protection layer to a case by using an adhesion layer.

12. A method for manufacturing an antenna, comprising the steps of:
    providing a ferrite sheet;
    forming at least one via hole through the ferrite sheet, wherein the via hole is connected between a first surface and a second surface of the ferrite sheet;
    forming a nonconductive ink layer on the first surface and the second surface and in the via hole of the ferrite sheet;
    applying a reduction-oxidation process to the nonconductive ink layer so as to form a metal atomic layer on the nonconductive ink layer; and
    applying a chemical-plating process to the metal atomic layer so as to form a metal layer on the metal atomic layer, wherein the metal atomic layer and the metal layer extend from the first surface through the via hole to the second surface of the ferrite sheet.

13. The method as claimed in claim 12, wherein the reduction-oxidation process comprises soaking the nonconductive ink layer in a reducing agent.

14. The method as claimed in claim 13, wherein the reducing agent comprises at least one of sodium borohydride, hypophosphite, and amine compounds.

15. The method as claimed in claim 12, wherein the metal atomic layer comprises palladium.

16. The method as claimed in claim 12, wherein the metal layer comprises copper.

17. The method as claimed in claim 12, wherein the nonconductive ink layer comprises catalytic metal ions and epoxy.

18. The method as claimed in claim 12, wherein the chemical-plating process comprises using at least one of copper sulfate, formaldehyde, sodium hydroxide, and ethylenediamine tetraacetic acid.

* * * * *